United States Patent
Cheng

(10) Patent No.: US 12,207,461 B2
(45) Date of Patent: Jan. 21, 2025

(54) TIER EXPANSION OFFSET

(71) Applicant: Intel Corporation, Santa Clara, CA (US)

(72) Inventor: Li Cheng, Liaoning (CN)

(73) Assignee: Intel Corporation, Santa Clara, CA (US)

( * ) Notice: Subject to any disclaimer, the term of this patent is extended or adjusted under 35 U.S.C. 154(b) by 499 days.

(21) Appl. No.: 17/558,001

(22) Filed: Dec. 21, 2021

(65) Prior Publication Data

US 2023/0200061 A1 Jun. 22, 2023

(51) Int. Cl.
| | |
|---|---|
| *H10B 41/40* | (2023.01) |
| *H10B 41/20* | (2023.01) |
| *H10B 41/35* | (2023.01) |
| *H10B 41/50* | (2023.01) |
| *H10B 43/40* | (2023.01) |
| *H10B 43/50* | (2023.01) |
| *G11C 5/02* | (2006.01) |
| *G11C 11/408* | (2006.01) |

(Continued)

(52) U.S. Cl.
CPC ............. *H10B 41/35* (2023.02); *H10B 41/20* (2023.02); *H10B 41/40* (2023.02); *H10B 41/50* (2023.02); *H10B 43/40* (2023.02); *H10B 43/50* (2023.02); *G11C 5/025* (2013.01); *G11C 11/4085* (2013.01); *H10B 41/27* (2023.02); *H10B 43/27* (2023.02)

(58) Field of Classification Search
CPC ........ H10B 41/10; H10B 41/20; H10B 41/23; H10B 41/40–42; H10B 41/50; H10B 43/10; H10B 43/20; H10B 43/23; H10B 43/40; H10B 43/50; H01L 21/02507; H01L 29/27687; H01L 21/02065; H01L 21/02074; H01L 21/02664; H01L 21/302; H01L 21/304; H01L 21/30625; H01L 21/308–3083; H01L 21/3086; H01L 21/31051–31056; H01L 21/32115–32125; H01L 21/461–467; H01L 21/67219; G11C 5/025

See application file for complete search history.

(56) References Cited

U.S. PATENT DOCUMENTS

| | | | |
|---|---|---|---|
| 2020/0185408 A1* | 6/2020 | Song | H10B 43/10 |
| 2021/0126004 A1* | 4/2021 | Yamakita | H10B 41/40 |
| 2021/0335811 A1* | 10/2021 | Chung | H10B 41/40 |

(Continued)

*Primary Examiner* — Nicholas J Tobergte
*Assistant Examiner* — William Henry Anderson
(74) *Attorney, Agent, or Firm* — Jordan IP Law, LLC

(57) ABSTRACT

Systems, apparatuses, and methods may provide for technology for forming a pre-offset platform on top of a substrate. A memory block is formed, where the memory block includes a staircase area and a memory array area located adjacent the staircase area. The memory array area includes a plurality of memory pillars extending into the memory block. The staircase area has a first height, the memory array area has a second height, and a tier expansion height is defined as a difference between the second height and the first height. The pre-offset platform is located between the substrate and the staircase area of the memory block. The pre-offset platform is oriented and arranged to offset the tier expansion height so that an upper surface of the staircase area and an upper surface of the memory array area are located in a same plane.

20 Claims, 8 Drawing Sheets

(51) Int. Cl.
   *H10B 41/27*   (2023.01)
   *H10B 43/27*   (2023.01)

(56) References Cited

U.S. PATENT DOCUMENTS

2022/0068885 A1\* 3/2022 Lee ..................... G11C 5/025
2022/0285234 A1\* 9/2022 Yokomizo ............... H01L 24/80

\* cited by examiner

TIER EXPANSION OFFSET

TECHNICAL FIELD

Embodiments generally relate to memory structures. More particularly, embodiments relate to tier expansions that occurs during formation of a staircase area in a memory structure.

BACKGROUND

NAND-type flash memory ("NAND memory") may be organized into multiple cells, with each cell containing one or more bits of data and being accessible through an array of bit lines (columns) and word lines (rows). There is a continued demand for an increase in the number of tiers or wordlines (WL) in 3D NAND in every generation.

Unfortunately, tier expansion may occur during 3D NAND tier expansion. Such tier expansion may occur due to expansion during formation of memory pillars in a memory array area. After tier expansion happens, post chemical mechanical polishing (CMP) operations often leaves a film residual at low surface areas.

One existing solution is to use photoresist to create hard mask followed by a wet etch to only remove film residual at the low surface areas. Then another film may be used as fill followed by a chemical mechanical polishing (CMP) operation to make a suitably flat surface for formation of the next deck.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
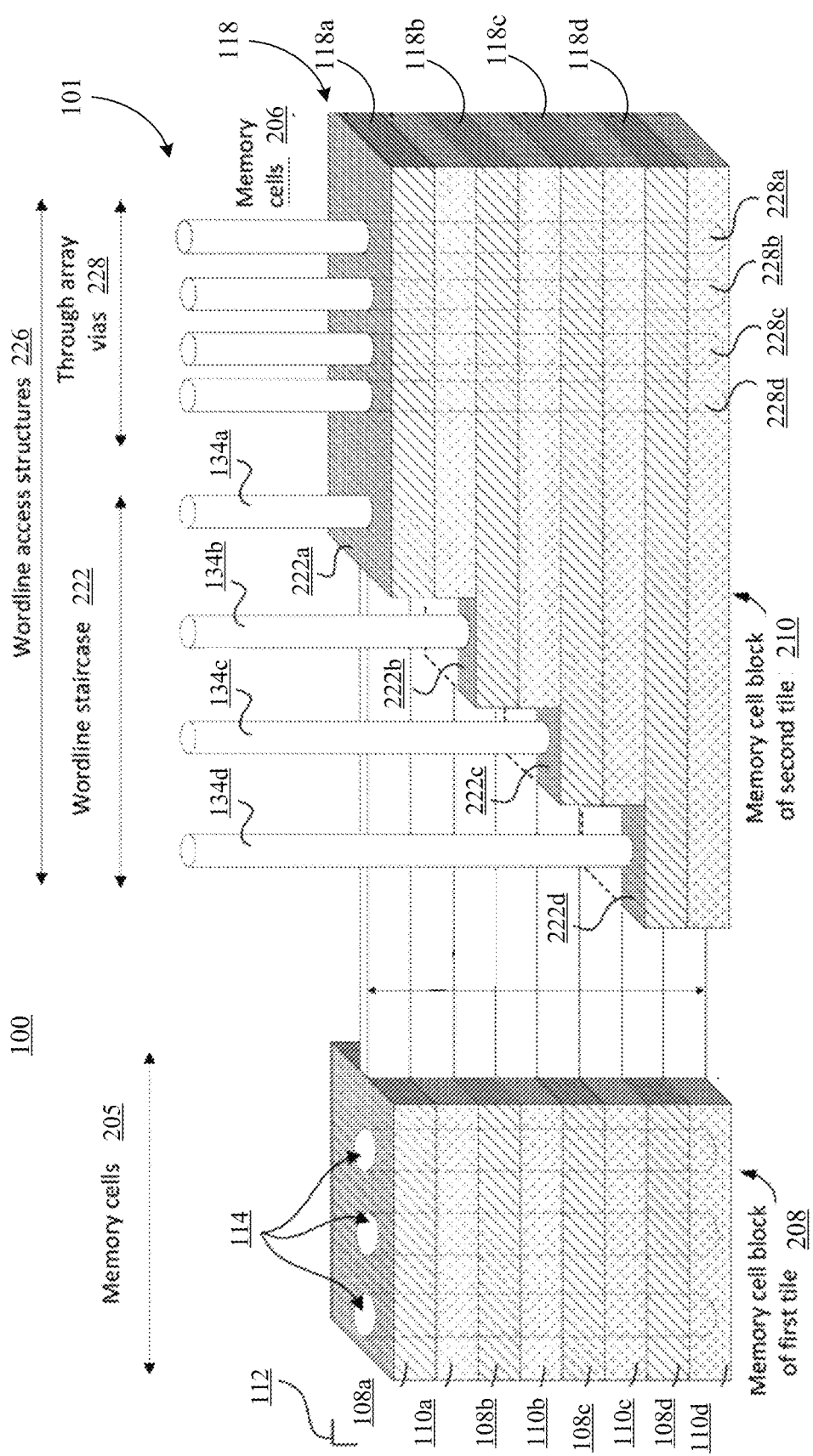
FIG. 1 is a block diagram of an example of a non-volatile memory device according to an embodiment.

As described above, after tier expansion happens, post chemical mechanical polishing (CMP) operations often leaves a film residual at low surface areas. One existing solution is to use photoresist to create hard mask followed by a wet etch to only remove film residual at the low surface areas, then fill with another film with a chemical mechanical polishing (CMP) process to make a suitably flat surface for formation of the next deck.

Such an additional chemical mechanical polishing (CMP) typically cannot make the non-expansion area perfectly flat. Unfortunately, surface irregularities in the topography will typically transfer to next deck. Such surface irregularities from tier expansion transition areas may impact some processes. For example, pillar miss alignment and top plug formation fails may result from surface irregularities from tier expansion transition areas. During 3D NAND manufacturing and development, tier expansion reduces processes margins, and with more tiers likely in future generation, existing solution may be disadvantageous.

As will be descried in greater detail below, systems, apparatuses, and methods are described that may provide for technology for forming a pre-offset platform on top of a substrate. A memory block is formed, where the memory block includes a staircase area and a memory array area located adjacent the staircase area. The memory array area includes a plurality of memory pillars extending into the memory block. The staircase area has a first height, the memory array area has a second height, and a tier expansion height is defined as a difference between the second height and the first height. The pre-offset platform is located between the substrate and the staircase area of the memory block. The pre-offset platform is oriented and arranged to offset the tier expansion height so that an upper surface of the staircase area and an upper surface of the memory array area are located in a same plane.

Tier expansion amount and location can be measured and predicted. Based on the amount and location, a film pattern may be built under the tiers to pre-offset such predicted tier expansion. After the tier expansion happens, the topographical surface should be suitably flat to avoid surface irregularities in the topography that might transfer to a next deck. For example, utilizing some of the techniques described herein the topographical surface will be suitably flat to avoid pillar miss alignment and top plug formation fails in subsequent decks.

Some of the techniques described herein build certain structures under 3D NAND cell tiers to offset later occurring tier expansion. Advantageously, such techniques provide for a reduction in 3D NAND tier expansion impacts and can save costs compared with existing methods.

The existing solution described above typically use a photoresist, a wet etch, a deposition, and a CMP to clean residuals and repair topography after tier expansion happen. Conversely, some of the techniques described herein could bypass performance of the deposition and CMP processes to save costs.

Additionally, a Scanning Electron Microscope (SEM) analysis of experimental results utilizing the techniques described herein reveals that pillar and cell formation are advantageously not impacted. Additionally, an atomic force microscopy (AFM) analysis of experimental results utilizing the techniques described herein reveals that for the topography change, AFM result show an improvement from 150 nm to 20 nm in surface irregularities.

FIG. 1 is a block diagram of an example of a memory device 100 according to an embodiment. As illustrated, the memory device 100 is a non-volatile memory device including a deck 101 of 3D NAND. In some implementations, memory device 100 includes a plurality of decks 101 (e.g., Deck 0, Deck 1, Deck 2, and Deck 3, or the like), with each deck including a structure similar to that illustrated here.

In some implementations, memory device 100 includes a memory cell block of a first tile 208 and a memory cell block of a second tile 210 electrically coupled to with wordline access structures 218 and 226, respectively.

The memory cell block of the first tile 208 includes a wordline 108a, a dielectric 110a, a wordline 108b, a dielectric 110b, a wordline 108c, a dielectric 110c, a wordline 108d, a dielectric 110d (collectively, a wordline stack 112), according to one embodiment. The wordlines 108a, 108b, 108c, and 108d (collectively, wordlines 108) are a simplified representation of a number of wordlines (e.g., 32 wordlines, 64 wordlines, etc.) that may be included in a 3D NAND memory array, according to one embodiment. The wordlines 108 are conductive layers such as silicon layers or polysilicon layers, according to one embodiment. The dielectrics 110a, 110b, 110c, and 110d (collectively, dielectrics 110) are simplified representation of a number of dielectric layers that may be used to separate the wordlines 108, according to one embodiment. For example, the dielectrics 110 are oxide layers, silicon dioxide layers, the like, and/or combinations thereof. The memory cell block of the first tile 208 includes memory cell strings 114 of memory cells 205 that are included in the memory cell block of the first tile 208, according to one embodiment. The memory cell string 114 are simplified illustration is representative of, for example, multiple kilobytes of memory cells, according to one embodiment. The memory cell block of the second tile 210 includes a similar arrangement.

The memory cell block of the second tile 210 includes wordline access structures 226 that provide upper metal levels and lower peripheral circuitry with access to the wordlines 118, according to one embodiment. The wordline access structures 226 include through array vias 228, according to one embodiment. The through array vias 228 provide metal levels and circuitry that are fabricated beneath the memory cell block of a second tile 210 with access to the wordlines 118, according to one embodiment. The through array vias 228 individually include a via 228a, a via 228b, a via 228c, and a via 228d, which couple the upper metal levels to circuitry beneath the memory cell array and which couple the metal contacts 134 to the circuitry beneath the memory cell array, according to one embodiment.

The wordline access structures 226 include a wordline staircase 222, according to one embodiment. The wordline staircase 222 provide metal levels and circuitry that are fabricated above the memory cell block of the second tile 210 with access to the wordlines 118, according to one embodiment. The wordline staircase 222 includes a wordline staircase step 222a that provides access to the wordline 118a, a wordline staircase step 222b that provides access to the wordline 118b, a wordline staircase step 222c that provides access to the wordline 118c, and a wordline staircase step 222d that provides access to the wordline 118d, according to one embodiment. Although the wordline staircase 222 is illustrated with only four steps, for simplification purposes, the wordline staircase 222 may include as many steps as wordlines included in the wordline stack, according to one embodiment. The wordline staircase 222 provides access to the wordlines 118 (e.g., individually, wordlines 118a, wordlines 118b, wordlines 118c, and wordlines 118d) for metal contacts 134 (e.g., individually, metal contact 134a, 134b, 134c, and 134d), according to one embodiment.

In some implementations, each of the decks 101 may include an array of memory cells 205. Examples of multi-deck or multi-layer memory architectures include multi-deck crosspoint memory and 3D NAND memory. Different memory technologies have adopted different terminology. For example, a deck in a crosspoint memory device typically refers to a layer of memory cell stacks that can be individually addressed. In contrast, a 3D NAND memory device is typically said to include a NAND array that includes many layers, as opposed to decks. In 3D NAND, a deck may refer to a subset of layers of memory cells (e.g., two decks of X-layers to effectively provide a 2X-layer NAND device). The term "deck" will be used throughout this disclosure to describe a layer, a tier, or a similar portion of a three-dimensional memory.

The memory device 100 may include non-volatile memory and/or volatile memory. Non-volatile memory is a storage medium that does not require power to maintain the state of data stored by the medium. In one embodiment, the memory structure is a block addressable storage device, such as those based on NAND or NOR technologies. A storage device may also include future generation nonvolatile devices, such as a three-dimensional (3D) crosspoint memory device, or other byte addressable write-in-place nonvolatile memory devices. In one embodiment, the storage device may be or may include memory devices that use silicon-oxide-nitride-oxide-silicon (SONOS) memory, electrically erasable programmable read-only memory (EEPROM), chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The term "storage device" may refer to the die itself and/or to a packaged memory product. In some embodiments, 3D crosspoint memory may comprise a transistor-less stackable cross point architecture in which memory cells sit at the intersection of word lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD235, JESD218, JESD219, JESD220-1, JESD223B, JESD223-1, or other suitable standard (the JEDEC standards cited herein are available at jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at jedec.org). Such standards (and similar standards) may be referred to as DDR-based standards and communication interfaces of the storage devices that implement such standards may be referred to as DDR-based interfaces.

The memory array of FIG. 1 is one example of memory device 100, however, the techniques described herein may not be limited in this regard. Accordingly, memory device 100 may include memory devices with one or multiple layers or multiple decks of memory cells. Thus, memory systems may be designed to have one or more packages, each of which may include one or more memory dies.

As will be described in greater detail below, systems, apparatuses and methods of some implementations herein provide for technology that provides the capability to build certain structures under 3D NAND cell tiers to offset later occurring tier expansion.

Figure 2:
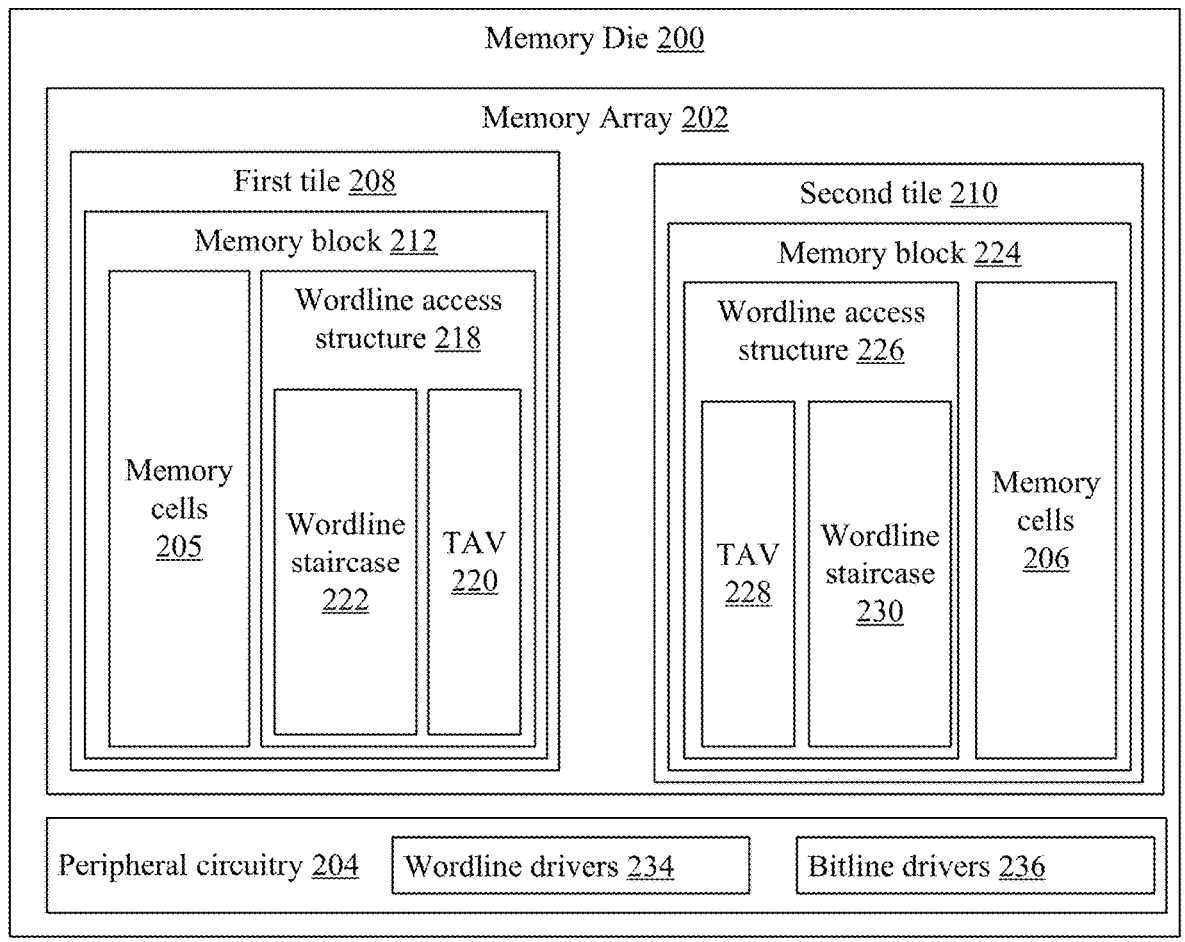
FIG. 2 illustrates an example side view diagram of a memory die according to an embodiment.

FIG. 2 illustrates a simplified example side view diagram of a memory die 200, consistent with one embodiment of the present disclosure. The memory die 200 includes a 3D flash memory architecture and utilizes a wordline bridge to share wordline access structures between two tiles of a memory array, according to one embodiment.

The memory die 200 includes a memory array 202 and peripheral circuitry 204, according to one embodiment. The memory array 202 includes memory cells 205 and memory cells 206 that are accessed (e.g., read/write) with the peripheral circuitry 204, according to one embodiment. The peripheral circuitry 204 is fabricated at least partially under the memory array 202 in the memory die 200, for example, using CMOS under the array fabrication techniques, according to one embodiment.

The memory array 202 is segmented into a first tile 208 and a second tile 210, according to one embodiment. Although two tiles are illustrated and described the memory array 202 may be segmented into 10's or 100's of tiles to facilitate access and operation of the memory array 202, according to one embodiment. The first tile 208 includes a memory block 212, which includes the memory cells 205 and wordline access structures 218, according to one embodiment. The wordline access structures 218 include through array vias 220 and a wordline staircase 222, according to one embodiment. The through array vias 220 connect wordlines for the memory cells 205 to the peripheral circuitry 204, under the memory array 202, according to one embodiment. The wordline staircase 222 represents a wordline staircase structure that may be used to connect the wordlines of the memory cells 205 to metal contacts for connection to upper metal levels, according to one embodiment. The wordline access structures 218 are illustrated disproportionately large in comparison to the memory cells 205 for illustration purposes. In practice, the memory cells 205 may occupy a significantly larger area in the memory array that the wordline access structures 218, according to one embodiment.

The second tile 210 includes a memory block 224, which includes the memory cells 206 and wordline access structures 226, according to one embodiment. The wordline access structures 226 include through array vias 228 and a wordline staircase 230, according to one embodiment. The through array vias 228 pass through the memory block 224 to couple upper metal levels to the peripheral circuitry 204, according to one embodiment. The wordline staircase 230 provides landings and/or a structure to which metal contacts connect the wordlines of the memory cells 206 to upper metal levels that are on top of or above the memory array 202, according to one embodiment.

The peripheral circuitry 204 includes wordline drivers 234 and bitline drivers 236 that drive wordlines and bitlines for the memory array 202, according to one embodiment.

Figure 3A:
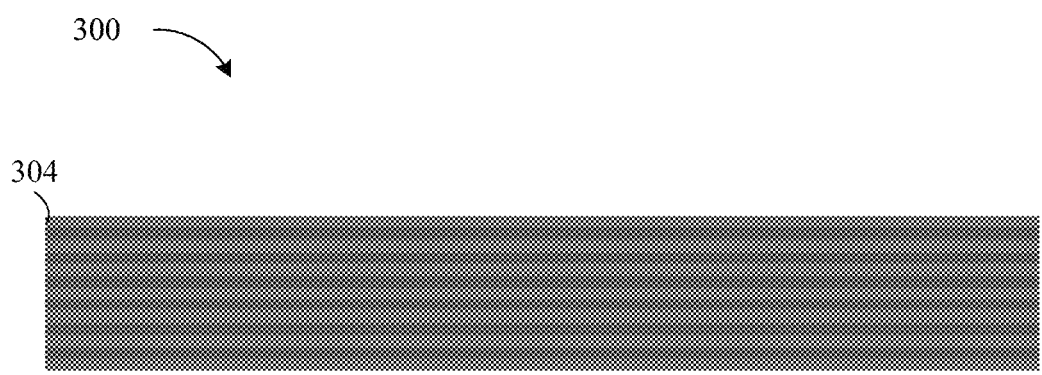
FIGS. 3A-3B illustrate diagrams of an example existing memory device at various stages of formation.
Figure 3B:
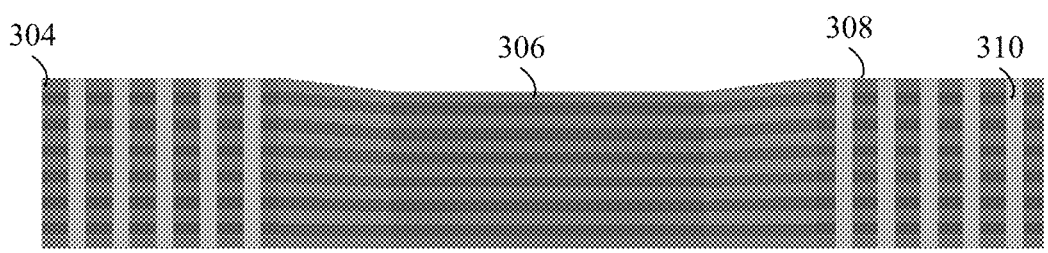

FIGS. 3A-3B illustrate diagrams of an example existing memory device 300 at various stages of formation. As illustrated, the memory device 300 includes a memory block 304.

The existing memory device 300 included a memory block 304. The memory block 304 includes a staircase area 306 and a memory array area 308 located adjacent the staircase area 306.

Referring to FIG. 3B, after tier expansion, the memory array area 308 includes a plurality of memory pillars 310 extending into the memory block 304.

The staircase area 306 has a first height and the memory array area 308 has a second height. A tier expansion height is defined herein as a difference between the second height and the first height.

As illustrated, the tier expansion height difference between the first height of the staircase area 306 and the second height of the memory array area 308 presents challenges when additional decks are to be formed on top of the memory block 304.

Figure 4A:
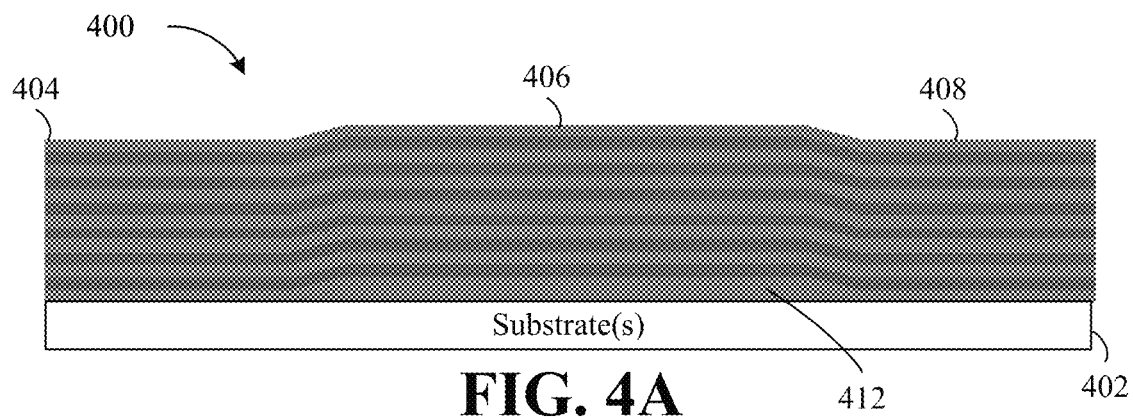
FIGS. 4A-4B illustrate diagrams of an example memory device at various stages of formation according to an embodiment.
Figure 4B:
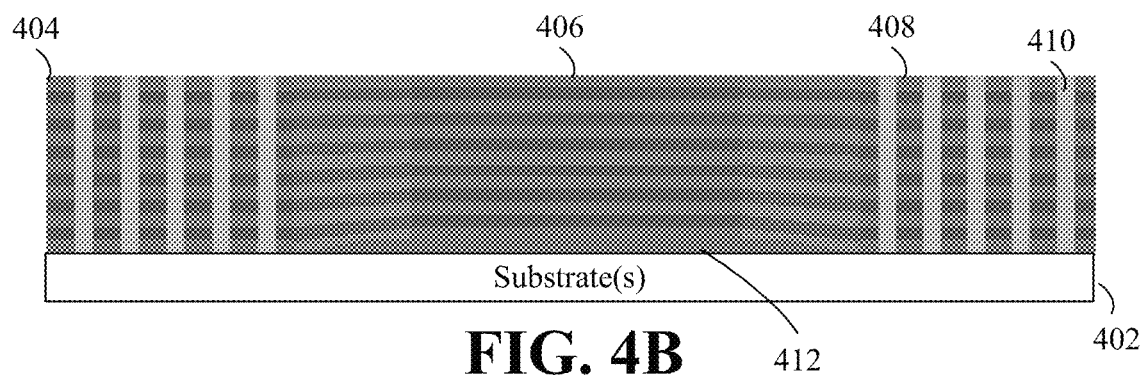

FIGS. 4A-4B illustrate diagrams of an example memory device 400 at various stages of formation according to an embodiment. As illustrated, the memory device 400 is implementable as a multi-deck non-volatile memory structure. Accordingly, the memory device 400 may include a plurality of decks, although only a single deck is illustrated here.

In some implementations, the memory device 400 included a substrate 402 and a memory block 404 located on top of the substrate 402. For example, substrate 402 may include silicon, sapphire, gallium arsenide, the like, and/or combinations thereof. The memory block 404 includes a staircase area 406 and a memory array area 408 located adjacent the staircase area 406.

Referring to FIG. 4B, after tier expansion, the memory array area 408 includes a plurality of memory pillars 410 extending into the memory block 404.

The staircase area 406 has a first height and the memory array area 408 has a second height different than the first height, as illustrated in FIG. 4B. A tier expansion height is defined herein as a non-zero difference between the second height and the first height.

As illustrated, the tier expansion height difference between the first height of the staircase area 406 and the second height of the memory array area 408 is compensated for by a pre-offset platform 412. In some implementations, the pre-offset platform 412 includes silicon nitride (nitride), silicon dioxide (oxide), the like, and/or combinations thereof.

For example, the tier expansion height difference between the first height of the staircase area 406 and the second height of the memory array area 408 is due to tier expansion from formation of the plurality of memory pillars 410 in the memory array area 408.

In some implementations, the pre-offset platform 412 is located between the substrate 402 and the staircase area 406 of the memory block 404. As illustrated in FIG. 4B, the pre-offset platform does not extend between the substrate 402 and the memory array area 408. The pre-offset platform 412 is oriented and arranged to offset the tier expansion height so that an upper surface of the staircase area 406 and an upper surface of the memory array 408 area are located in a same plane. As illustrated in FIG. 4B, a lowermost layer of memory array area 408 has a lowermost surface that is coplanar with a lowermost surface of the pre-offset platform 412.

As used herein, the term "same plane" refers to the upper surface of the staircase area 406 and the upper surface of the memory array 408 area being located in exactly the same plane or substantially in the same plane. For example, the upper surface of the staircase area 406 and the upper surface of the memory array 408 area are considered located in substantially in the same plane when the height of the staircase area 406 plus the height of the pre-offset platform 412 is substantially similar to the height of the memory array area 408 (e.g., within 0.01-0.1%, 0.1-1.0%, 1.0%-5.0%, or the like).

In some implementations, the staircase area 406 is coupled to the plurality of decks (e.g., Deck 0, Deck 1, Deck 2, Deck 3, etc. in FIG. 1) via one or more stairwells (e.g., see wordline access structures 218 and 226 in FIG. 2). Additionally, a plurality of memory cells are associated with each of the plurality of memory pillars 410.

During formation, in some examples, the forming of the pre-offset platform 412 includes depositing a pre-offset layer on top of the substrate 402, patterning the pre-offset layer, removing a portion of the pre-offset layer, leaving the pre-offset platform, and cleaning the pre-offset platform.

Figure 5A:
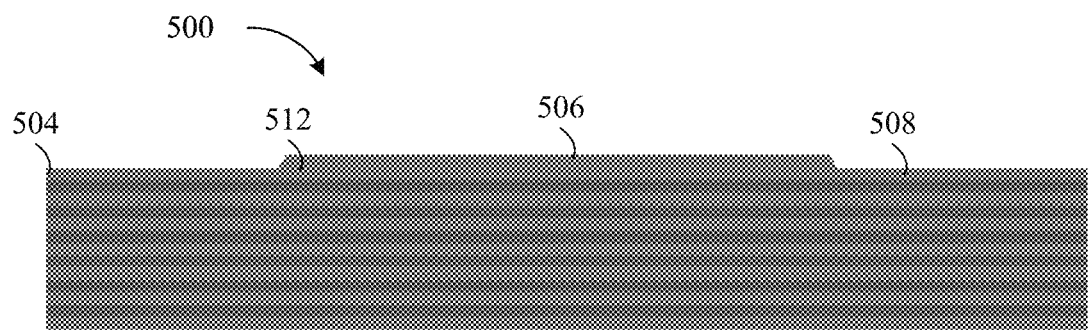
FIGS. 5A-5C illustrate diagrams of another example memory device at various stages of formation according to an embodiment.
Figure 5B:
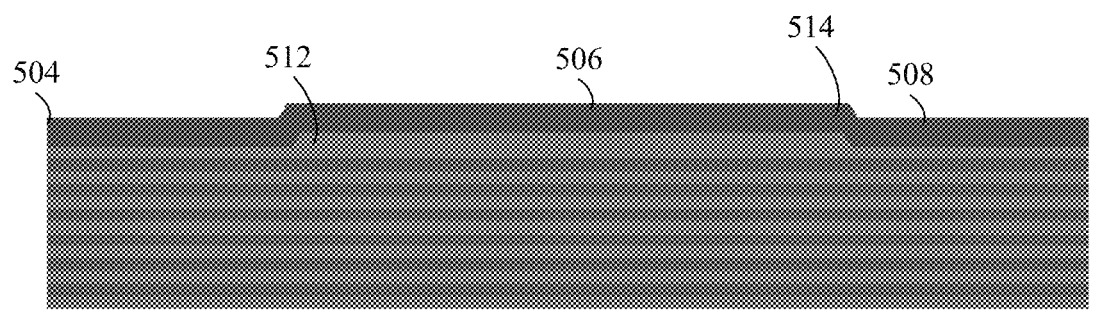
Figure 5C:
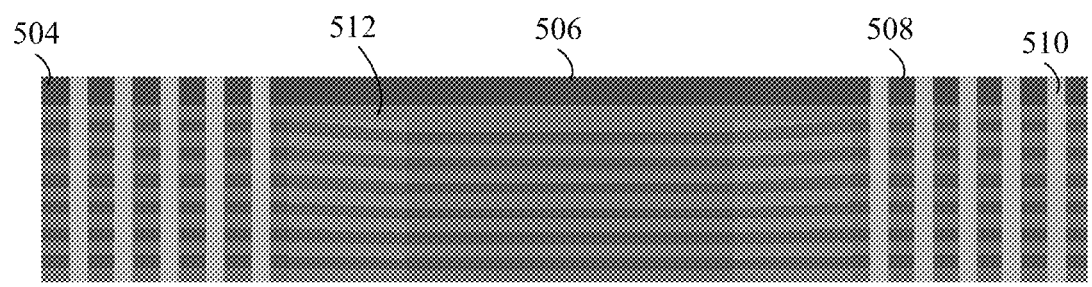

FIGS. 5A-5C illustrate diagrams of another example memory device 500 at various stages of formation according to an embodiment. As illustrated, the memory device 500 may include a second memory block 504 located on top of a first memory block (e.g., the memory block 404 in FIGS. 4A-4B). The second memory block 504 includes a second staircase area 506 and a second memory array area 508 located adjacent the second staircase area 506.

In some implementations, the memory device 500 may include a pre-offset cap 512 located on top of a second staircase area 506 of the second memory block 504. In some implementations, the pre-offset cap 512 is located between an insulation layer 514 (e.g., silicon nitride (nitride), silicon dioxide (oxide), the like, and/or combinations thereof) and the second staircase area 506 of the second memory block 504. The pre-offset cap 512 is oriented and arranged to offset a second tier expansion height so that an upper surface of the pre-offset cap 512 and an upper surface of a second memory array area 508 of the second memory block 504 are located in a same plane.

Referring to FIG. 5C, after tier expansion, the second memory array area 508 includes a plurality of memory pillars 510 extending into the second memory block 504.

As illustrated, the memory device 500 is implementable as a multi-deck non-volatile memory structure. Accordingly, the memory device 500 may include a plurality of decks, although only a single deck is illustrated here.

As illustrated, the tier expansion height difference between the first height of the second staircase area 506 and the second height of the second memory array area 508 is compensated for by the pre-offset cap 512. In some implementations, the pre-offset cap 512 includes silicon nitride (nitride), silicon dioxide (oxide), the like, and/or combinations thereof.

During formation, in some examples, the forming of the pre-offset cap 512 further includes depositing a pre-offset cap layer on top of the second memory block 504, patterning the pre-offset cap layer, removing a portion of the pre-offset cap layer to leave the pre-offset cap, and cleaning the pre-offset cap.

It will be appreciated that both the pre-offset platform 412 and the pre-offset cap 512 may both be utilized in a multi-deck structure. For example, one memory block might utilize the pre-offset platform 412 while a different memory block might utilize the pre-offset cap 512. Additionally, or alternatively, it is possible that in some implementations a single memory block would utilize both the pre-offset platform 412 and the pre-offset cap 512.

Figure 6:
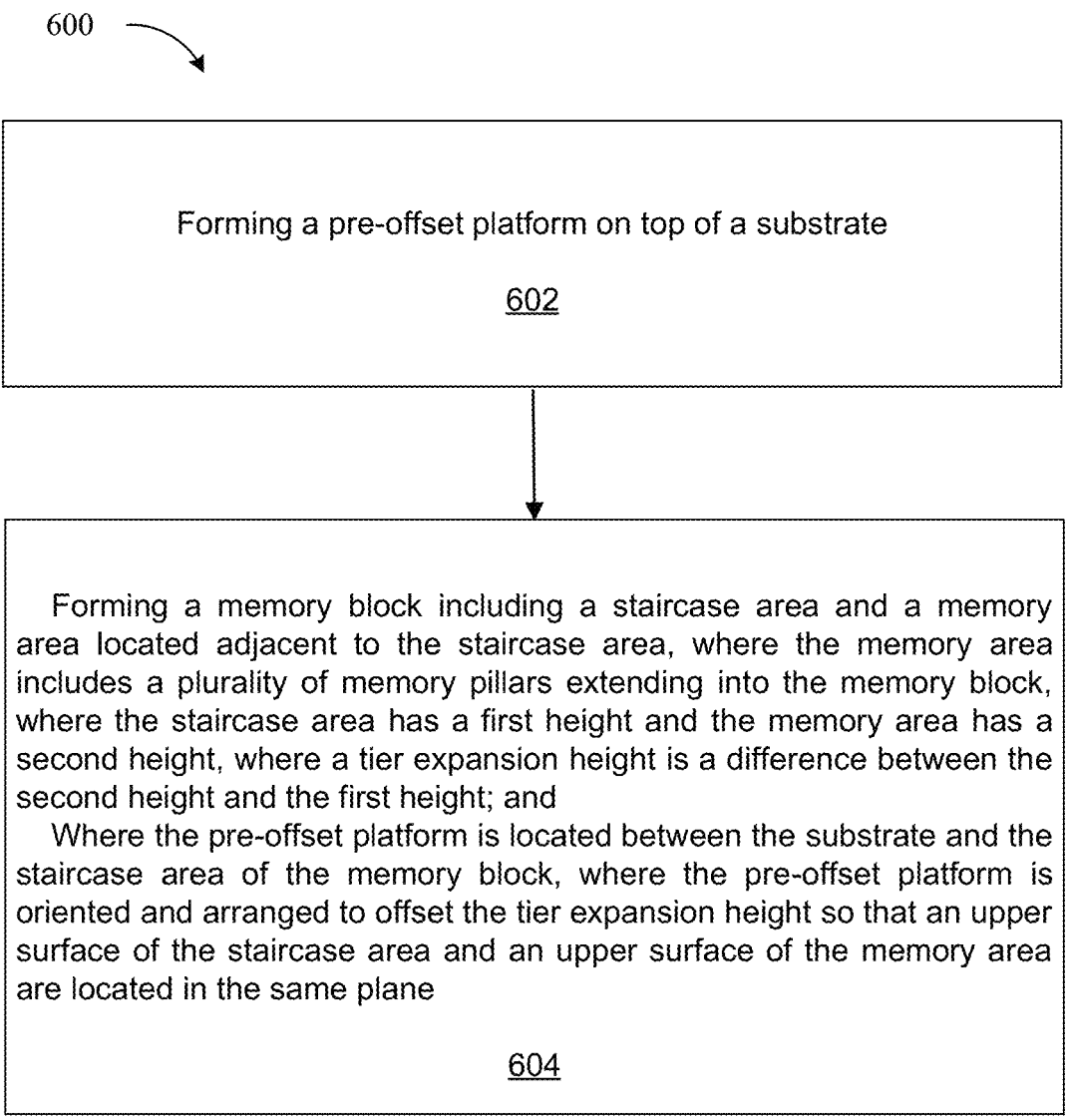
FIG. 6 is a flowchart of an example method of forming a memory device according to an embodiment.

FIG. 6 is a flowchart of an example method 600 of forming a memory device according to an embodiment. The method 600 may generally be implemented to form a memory device, such as, for example, the memory device 400 (e.g., see FIGS. 4A-4B) and/or the memory device 500 (e.g., see FIGS. 5A-5C), already discussed.

Illustrated processing block 602 provides for forming a pre-offset platform. For example, such a pre-offset platform may be formed on top of a substrate. Additionally, or alternatively, such a pre-offset platform may be formed between multiple decks of a memory device.

In some examples, the forming of the pre-offset platform further includes depositing a pre-offset layer on top of the substrate, patterning the pre-offset layer, removing a portion of the pre-offset layer, leaving the pre-offset platform, and cleaning the pre-offset platform.

Illustrated processing block 604 provides for forming a memory block. For example, such a memory block includes a staircase area and a memory array area located adjacent the staircase area. In such an example, the memory array area includes a plurality of memory pillars extending into the memory block. The staircase area has a first height, and the memory array area has a second height, and there is a tier expansion height that is a difference between the second height and the first height. For example, the tier expansion height may be formed due to tier expansion from formation of the plurality of memory pillars in the memory array area.

In some examples, the staircase area may be coupled to a plurality of decks via one or more stairwells. Additionally, a plurality of memory cells may be associated with each of the plurality of memory pillars.

In some implementations herein, the pre-offset platform is located between the substrate and the staircase area of the memory block. Additionally, or alternatively, such a pre-offset platform may be formed between multiple decks of a memory device.

In some implementations herein, the pre-offset platform is oriented and arranged to offset the tier expansion height so that an upper surface of the staircase area and an upper surface of the memory array area are located in a same plane.

Additionally, or alternatively, the method 600 also includes operations to form a second memory block located on top of the memory block. Such an operation may advantageously bypass a chemical mechanical polishing operation between the forming of the memory block and the forming of the second memory block, for example. In one example, the method 600 may also include operations to form a pre-offset cap located on top of a second staircase area of the second memory block, where the pre-offset cap is oriented and arranged to offset a second tier expansion height so that an upper surface of the pre-offset cap and an upper surface of a second memory array area of the second memory block are located in a same plane.

In some examples, the forming of the pre-offset cap further includes depositing a pre-offset cap layer on top of the second memory block, patterning the pre-offset cap layer, removing a portion of the pre-offset cap layer to leave the pre-offset cap, and cleaning the pre-offset cap.

Additional details regarding the various implementations of the method 600 are discussed below with regard to FIGS. 7 and 8.

Figure 7:
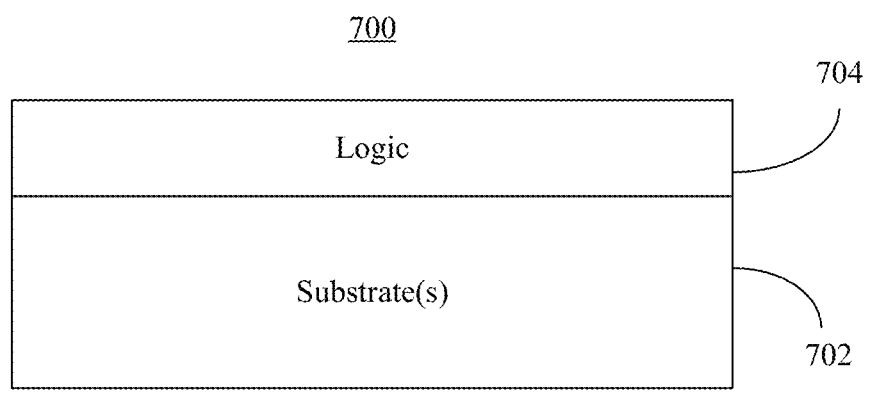
FIG. 7 is an illustration of an example of a semiconductor package apparatus according to an embodiment.

FIG. 7 shows a semiconductor apparatus 700 (e.g., chip, die, and/or package). The illustrated apparatus 700 includes one or more substrates 702 (e.g., silicon, sapphire, gallium arsenide) and logic 704 (e.g., transistor array and other integrated circuit/IC components) coupled to the substrate(s) 702. In an embodiment, the logic 704 implements one or more aspects of the memory device 400 (e.g., see FIGS. 4A-4B) and/or the memory device 500 (e.g., see FIGS. 5A-5C), already discussed.

In one example, the logic 704 includes transistor channel regions that are positioned (e.g., embedded) within the substrate(s) 702. Thus, the interface between the logic 704 and the substrate 702 may not be an abrupt junction. The logic 704 may also be considered to include an epitaxial layer that is grown on an initial wafer of the substrate 702.

Figure 8:
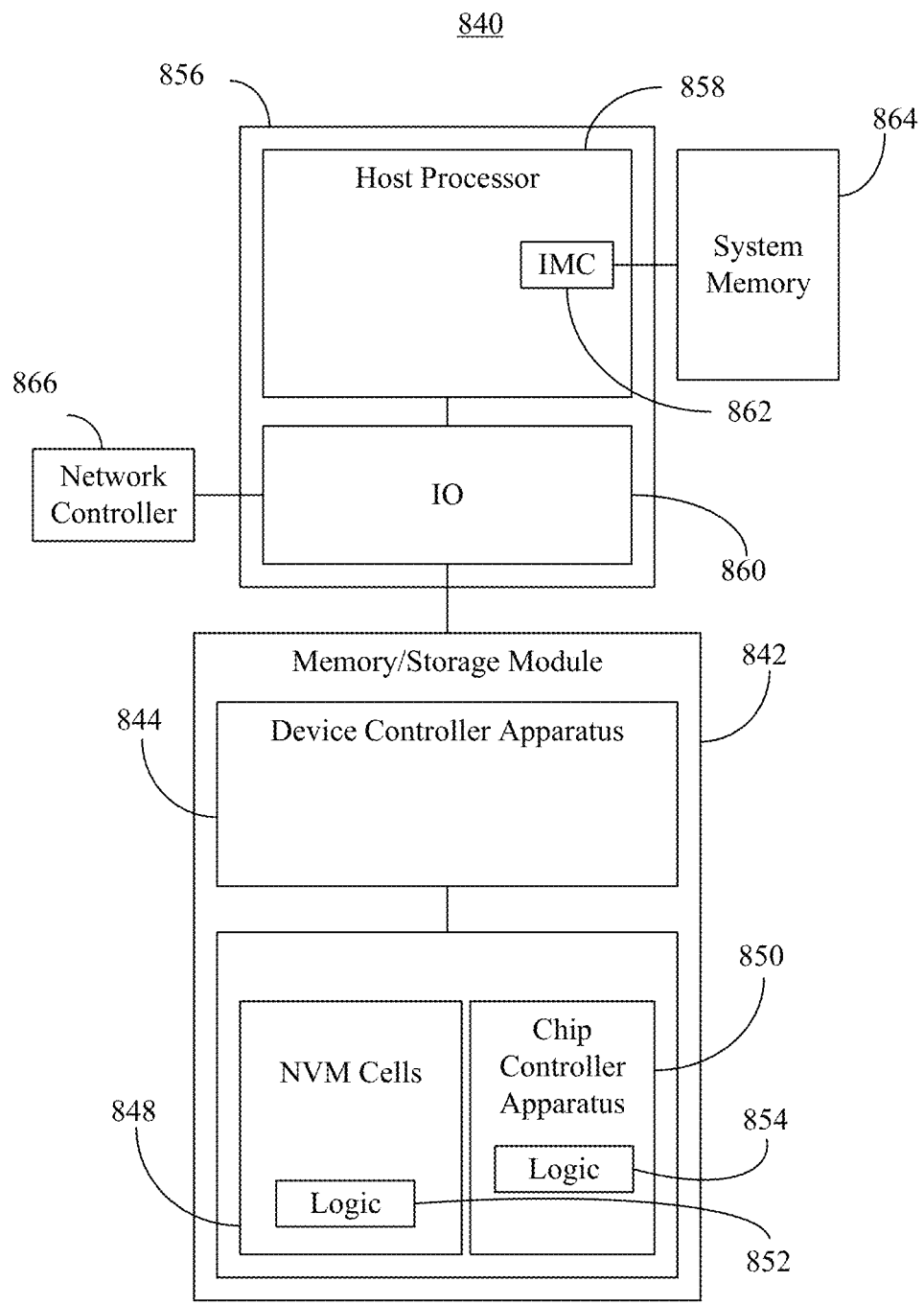
FIG. 8 is a block diagram of an example of a performance-enhanced computing system according to an embodiment.

Turning now to FIG. 8, a performance-enhanced computing system 840 is shown. In the illustrated example, a solid state drive (SSD) 842 includes a device controller apparatus 844 that is coupled to a NAND 846. The illustrated NAND 846 includes a memory device 848 having a set of multi-level NVM cells and logic 852 (e.g., transistor array and other integrated circuit/IC components coupled to one or more substrates containing silicon, sapphire and/or gallium arsenide), and a chip controller apparatus 850 that includes logic 854. The logic 854 may include one or more of configurable or fixed-functionality hardware.

The illustrated system 840 also includes a system on chip (SoC) 856 having a host processor 858 (e.g., central processing unit/CPU) and an input/output (I/O) module 860. The host processor 858 may include an integrated memory controller 862 (IMC) that communicates with system memory 864 (e.g., RAM dual inline memory modules/DIMMs). The illustrated IO module 860 is coupled to the SSD 842 as well as other system components such as a network controller 866.

In some embodiments, the NAND 846 implements one or more aspects of the memory device 400 (e.g., see FIGS. 4A-4B) and/or the memory device 500 (e.g., see FIGS. 5A-5C) already discussed. For example, the NAND 846 is implementable as a multi-deck non-volatile memory structure coupled to the device controller apparatus 844 (e.g., a memory controller), the multi-deck non-volatile memory structure including one or more of a plurality of decks includes a pre-offset cap and/or pre-offset platform as described herein.

ADDITIONAL NOTES AND EXAMPLES

Example 1 includes a memory device comprising: a substrate; a memory block located on top of the substrate, the memory block comprising: a staircase area having a first height; and a memory array area located adjacent the staircase area, the memory array area comprising a plurality of memory pillars extending into the memory block, wherein the memory array area has a second height, and wherein a tier expansion height is a difference between the second height and the first height; and a pre-offset platform located between the substrate and the staircase area of the memory block, wherein the pre-offset platform is oriented and arranged to offset the tier expansion height so that an upper surface of the staircase area and an upper surface of the memory array area are located in a same plane.

Example 2 includes the memory device of Example 1, further comprising: a second memory block located on top of the memory block; and a pre-offset cap located on top of a second staircase area of the second memory block, wherein the pre-offset cap is oriented and arranged to offset a second tier expansion height so that an upper surface of the pre-offset cap and an upper surface of a second memory array area of the second memory block are located in a same plane.

Example 3 includes the memory device of any one of Examples 1 to 2, wherein the tier expansion height is due to tier expansion from formation of the plurality of memory pillars in the memory array area.

Example 4 includes the memory device of any one of Examples 1 to 3, wherein the staircase area is coupled to a plurality of decks via one or more stairwells.

Example 5 includes the memory device of any one of Examples 1 to 4, wherein a plurality of memory cells are associated with each of the plurality of memory pillars.

Example 6 includes the memory device of any one of Examples 1 to 5, wherein the pre-offset platform comprises at least one of silicon nitride (nitride) and silicon dioxide (oxide).

Example 7 includes a system comprising: a memory controller; and a multi-deck non-volatile memory structure coupled to the memory controller, the multi-deck non-volatile memory structure comprising a plurality of decks, multi-deck non-volatile memory structure comprising: a substrate; a memory block located on top of the substrate, the memory block comprising: a staircase area having a first height; and a memory array area located adjacent the staircase area, the memory array area comprising a plurality of memory pillars extending into the memory block, wherein the memory array area has a second height, and wherein a tier expansion height is a difference between the second height and the first height; and a pre-offset platform located between the substrate and the staircase area of the memory block, wherein the pre-offset platform is oriented and arranged to offset the tier expansion height so that an upper surface of the staircase area and an upper surface of the memory array area are located in a same plane.

Example 8 includes the system of Example 7, further comprising: a second memory block located on top of the memory block; and a pre-offset cap located on top of a second staircase area of the second memory block, wherein the pre-offset cap is oriented and arranged to offset a second tier expansion height so that an upper surface of the pre-offset cap and an upper surface of a second memory array area of the second memory block are located in a same plane.

Example 9 includes the system of any one of Examples 7 to 8, wherein the tier expansion height is due to tier expansion from formation of the plurality of memory pillars in the memory array area.

Example 10 includes the system of any one of Examples 7 to 9, wherein the staircase area is coupled to the plurality of decks via one or more stairwells Example 11 includes the system of any one of Examples 7 to 10, wherein a plurality of memory cells are associated with each of the plurality of memory pillars.

Example 12 includes the system of any one of Examples 7 to 11, wherein the pre-offset platform comprises at least one of silicon nitride (nitride) and silicon dioxide (oxide).

Example 13 includes a method comprising: forming a pre-offset platform on top of a substrate; forming a memory block, the memory block comprising: a staircase area having a first height; and a memory array area located adjacent the staircase area, the memory array area comprising a plurality of memory pillars extending into the memory block, wherein the memory array area has a second height, and wherein a tier expansion height is a difference between the second height and the first height; and wherein the pre-offset platform is located between the substrate and the staircase area of the memory block, wherein the pre-offset platform is oriented and arranged to offset the tier expansion height so that an upper surface of the staircase area and an upper surface of the memory array area are located in a same plane.

Example 14 includes the method of Example 13, wherein the forming of the pre-offset platform further comprises: depositing a pre-offset layer on top of the substrate; patterning the pre-offset layer; removing a portion of the pre-offset layer, leaving the pre-offset platform; and cleaning the pre-offset platform.

Example 15 includes the method of any one of Examples 13 to 14, further comprising: forming a second memory block located on top of the memory block while bypassing a chemical mechanical polishing operation between the forming of the memory block and the forming of the second memory block.

Example 16 includes the method of any one of Examples 13 to 15, further comprising: forming a second memory block located on top of the memory block; and forming a pre-offset cap located on top of a second staircase area of the second memory block, wherein the pre-offset cap is oriented and arranged to offset a second tier expansion height so that an upper surface of the pre-offset cap and an upper surface of a second memory array area of the second memory block are located in a same plane.

Example 17 includes the method of any one of Examples 13 to 16, wherein the forming of the pre-offset cap further comprises: depositing a pre-offset cap layer on top of the second memory block; patterning the pre-offset cap layer; removing a portion of the pre-offset cap layer, leaving the pre-offset cap; and cleaning the pre-offset cap.

Example 18 includes the method of any one of Examples 13 to 17, wherein the tier expansion height is due to tier expansion from formation of the plurality of memory pillars in the memory array area.

Example 19 includes the method of any one of Examples 13 to 18, wherein the staircase area is coupled to a plurality of decks via one or more stairwells Example 20 includes the method of any one of Examples 13 to 19, wherein a plurality of memory cells are associated with each of the plurality of memory pillars.

Example 21 includes an apparatus comprising means for performing the method of any one of Examples 13 to 20.

Example 22 includes a machine-readable storage comprising machine-readable instructions, which when executed, implement a method or realize an apparatus as claimed in any preceding claim.

Technology described herein therefore provides the capability to build certain structures under 3D NAND cell tiers to offset later occurring tier expansion. Advantageously, such techniques provide for a reduction in 3D NAND tier expansion impacts and can save costs compared with existing methods.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

I claim:

1. A memory device comprising:
a substrate;
a memory block located on top of the substrate, the memory block comprising:
a staircase area having a first height; and
a memory array area located adjacent the staircase area, the memory array area comprising a plurality of memory pillars extending into the memory block, wherein the memory array area has a second height different than the first height, and wherein a tier expansion height is a non-zero difference between the second height and the first height; and a pre-offset platform located between the substrate and the staircase area of the memory block, wherein a lowermost layer of the memory array area has a lowermost surface that is coplanar with a lowermost surface of the pre-offset platform, and wherein the pre-offset platform is oriented and arranged to offset the tier expansion height so that an upper surface of the staircase area and an upper surface of the memory array area are located in a same plane.

2. The memory device of claim 1, further comprising:

a second memory block located on top of the memory block; and a pre-offset cap located on top of a second staircase area of the second memory block, wherein the pre-offset cap is oriented and arranged to offset a second tier expansion height so that an upper surface of the pre-offset cap and an upper surface of a second memory array area of the second memory block are located in a same plane.

3. The memory device of claim 1, wherein the tier expansion height is due to tier expansion from formation of the plurality of memory pillars in the memory array area.

4. The memory device of claim 1, wherein the staircase area is coupled to a plurality of decks via one or more stairwells.

5. The memory device of claim 1, wherein a plurality of memory cells are associated with each of the plurality of memory pillars.

6. The memory device of claim 1, wherein the pre-offset platform comprises at least one of silicon nitride (nitride) and silicon dioxide (oxide).

7. A system comprising:

a memory controller; and a multi-deck non-volatile memory structure coupled to the memory controller, the multi-deck non-volatile memory structure comprising a plurality of decks, the multi-deck non-volatile memory structure comprising:

a substrate;

a memory block located on top of the substrate, the memory block comprising:

a staircase area having a first height; and a memory array area located adjacent the staircase area, the memory array area comprising a plurality of memory pillars extending into the memory block, wherein the memory array area has a second height different than the first height, and wherein a tier expansion height is a non-zero difference between the second height and the first height; and a pre-offset platform located between the substrate and the staircase area of the memory block, wherein a lowermost layer of the memory array area has a lowermost surface that is coplanar with a lowermost surface of the pre-offset platform, and wherein the pre-offset platform is oriented and arranged to offset the tier expansion height so that an upper surface of the staircase area and an upper surface of the memory array area are located in a same plane.

8. The system of claim 7, further comprising:

a second memory block located on top of the memory block; and a pre-offset cap located on top of a second staircase area of the second memory block, wherein the pre-offset cap is oriented and arranged to offset a second tier expansion height so that an upper surface of the pre-offset cap and an upper surface of a second memory array area of the second memory block are located in a same plane.

9. The system of claim 7, wherein the tier expansion height is due to tier expansion from formation of the plurality of memory pillars in the memory array area.

10. The system of claim 7, wherein the staircase area is coupled to the plurality of decks via one or more stairwells.

11. The system of claim 7, wherein a plurality of memory cells are associated with each of the plurality of memory pillars.

12. The system of claim 7, wherein the pre-offset platform comprises at least one of silicon nitride (nitride) and silicon dioxide (oxide).

13. A method comprising:

forming a pre-offset platform on top of a substrate;

forming a memory block, the memory block comprising:

a staircase area having a first height; and a memory array area located adjacent the staircase area, the memory array area comprising a plurality of memory pillars extending into the memory block, wherein the memory array area has a second height different than the first height, and wherein a tier expansion height is a non-zero difference between the second height and the first height; and wherein the pre-offset platform is located between the substrate and the staircase area of the memory block, wherein a lowermost layer of the memory array area has a lowermost surface that is coplanar with a lowermost surface of the pre-offset platform, and wherein the pre-offset platform is oriented and arranged to offset the tier expansion height so that an upper surface of the staircase area and an upper surface of the memory array area are located in a same plane.

14. The method of claim 13, wherein the forming of the pre-offset platform further comprises:

depositing a pre-offset layer on top of the substrate;

patterning the pre-offset layer;

removing a portion of the pre-offset layer, leaving the pre-offset platform; and cleaning the pre-offset platform.

15. The method of claim 13, further comprising:

forming a second memory block located on top of the memory block while bypassing a chemical mechanical polishing operation between the forming of the memory block and the forming of the second memory block.

16. The method of claim 13, further comprising:

forming a second memory block located on top of the memory block; and forming a pre-offset cap located on top of a second staircase area of the second memory block, wherein the pre-offset cap is oriented and arranged to offset a second tier expansion height so that an upper surface of the pre-offset cap and an upper surface of a second memory array area of the second memory block are located in a same plane.

17. The method of claim 16, wherein the forming of the pre-offset cap further comprises:

depositing a pre-offset cap layer on top of the second memory block;

patterning the pre-offset cap layer;

removing a portion of the pre-offset cap layer, leaving the pre-offset cap; and cleaning the pre-offset cap.

18. The method of claim 13, wherein the tier expansion height is due to tier expansion from formation of the plurality of memory pillars in the memory array area.

19. The method of claim 13, wherein the staircase area is coupled to a plurality of decks via one or more stairwells.

20. The method of claim 13, wherein a plurality of memory cells are associated with each of the plurality of memory pillars.

* * * * *